(12) United States Patent
Tanomura

(10) Patent No.: US 6,403,436 B1
(45) Date of Patent: Jun. 11, 2002

(54) SEMICONDUCTOR DEVICE AND METHOD OF MANUFACTURING THE SAME

(75) Inventor: Masahiro Tanomura, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/619,337

(22) Filed: Jul. 19, 2000

(30) Foreign Application Priority Data

Jul. 19, 1999 (JP) ............................................. 11-204433

(51) Int. Cl.[7] ............................................. H01L 21/331
(52) U.S. Cl. ..................... 438/312; 438/314; 438/322; 438/330; 257/565; 257/198; 257/562
(58) Field of Search ................................ 438/312–314, 438/318, 322, 326, 329, 330; 257/565, 516, 526, 539, 525, 198, 197, 201, 580, 582, 615

(56) References Cited

U.S. PATENT DOCUMENTS 6,043,520 A * 3/2000 Yamamoto et al. ......... 257/198

* cited by examiner

Primary Examiner—John F. Niebling
Assistant Examiner—Yennhu B. Huynh

(57) ABSTRACT

Subcollector layers or emitter layers constituting a bipolar transistor having different thicknesses form a two-layered structure. A resistor layer is formed at the same as one of the subcollector layers or one of the emitter layers, from the same material as that of the subcollector layer or emitter layer. A resistor is formed by the resistor layer made of the same material as that of the subcollector layer or emitter layer. A resistor with a desired resistance can be integrally built into a semiconductor device without adversely affecting the characteristics of a bipolar transistor.

8 Claims, 6 Drawing Sheets

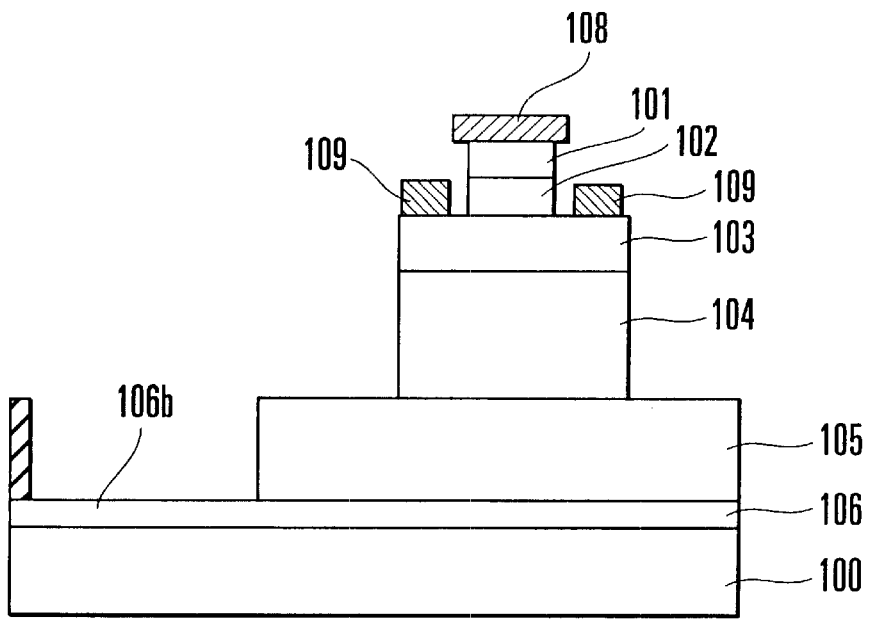
F I G. 5
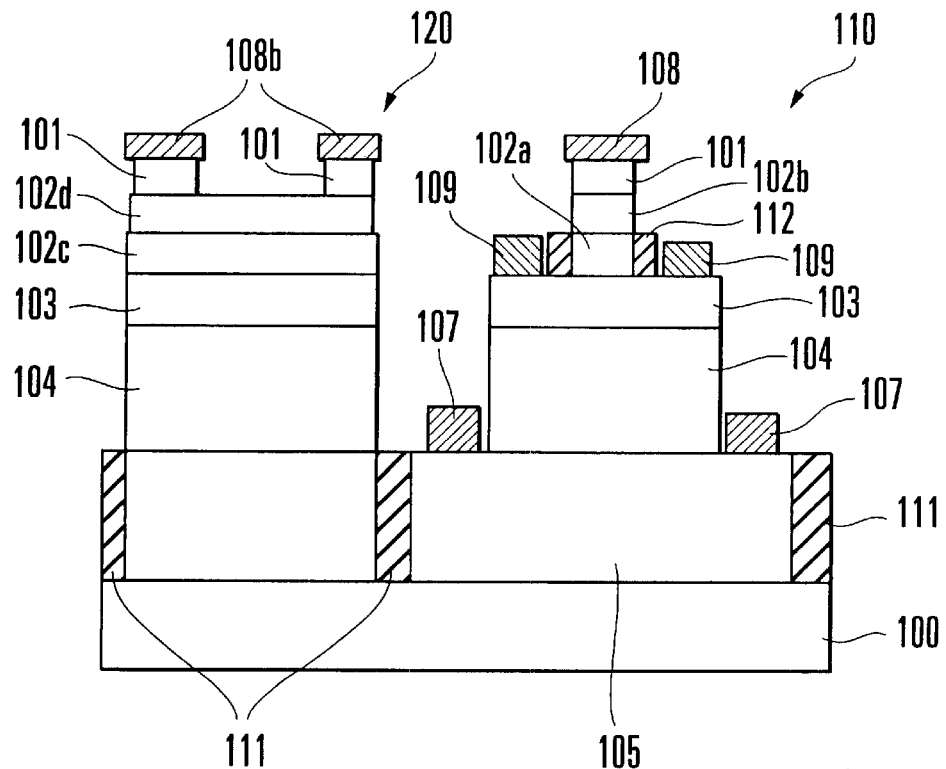
F I G. 6

SEMICONDUCTOR DEVICE AND METHOD OF MANUFACTURING THE SAME

BACKGROUND OF THE INVENTION

The present invention relates to a semiconductor device and a method of manufacturing the same and, more particularly, to a semiconductor device having an integral built-in bipolar transistor and resistor, and a method of manufacturing the same.

A transistor and resistor are integrally built into some semiconductor device by using a wafer epitaxially grown on a substrate. An example of a transistor used in a semiconductor device of this type includes a heterojunction bipolar transistor (to be referred to as an HBT hereinafter) or any other types of bipolar transistor.

In the semiconductor device described above having the integral built-in HBT and resistor, for example, as shown in FIG. 11, a subcollector layer 301 is epitaxially grown on an insulating semiconductor substrate 300 made of GaAs, a collector layer 302, base layer 303, and emitter layer 304 are sequentially epitaxially grown on the subcollector layer 301, and a collector electrode 305, base electrode 306, and emitter electrode 307 are respectively formed on the subcollector layer 301, the base layer 303, and an emitter cap layer 308 on the emitter layer 304, respectively. With this arrangement, a heterojunction bipolar transistor (HBT) device 310 is formed on the semiconductor substrate 300.

In the semiconductor device shown in FIG. 11, an interlevel insulating film 311 is formed on the HBT device 310 described above, a metal resistor 313 is formed on the interlevel insulating film 311, and a pair of metal resistor electrodes 312 are formed on the metal resistor 313. In this manner, the HBT and resistor are integrally built into the semiconductor device.

In the semiconductor device having the arrangement shown in FIG. 11, since the interlevel insulating film 311 is arranged between the metal resistor 313 and subcollector layer 301, it serves as a capacitance component. The resistance of the metal resistor 313 is thus influenced by the capacitance component, and a net resistance cannot be obtained. Also, an extra manufacturing process is necessary for forming the metal resistor 313.

In a semiconductor device shown in FIG. 12 having a built-in HBT device, a subcollector layer 301b is formed adjacent to a subcollector layer 301 that forms an HBT, a resistor is formed by using the subcollector layer 301b, and a pair of metal resistor electrodes 312 are formed on this resistor 301b. Implantation regions 309 are formed for element isolation.

In the semiconductor device shown in FIG. 12, since the subcollector layer 301b is used as an access layer between the subcollector layer 301 and the HBT device, its resistance must be as low as possible, and accordingly the sheet resistance cannot be increased. When a high-resistance resistor is to be formed, the area of the subcollector layer 301b used as the resistor undesirably increases.

In a semiconductor device shown in FIG. 13, while a subcollector layer 301, collector layer 302, and base layer 303 that form an HBT are epitaxially grown, a subcollector layer 301b, collector layer 302b, and base layer 303b are formed by epitaxial growth. The base layer 303b located at the uppermost position of the HBT is used as a resistor, and a pair of resistor electrodes 312 are formed on this resistor 303b. Implantation regions 309 are formed for element isolation in the same manner as in FIG. 12.

In the semiconductor device shown in FIG. 13, when the collector layer 302b with a high resistance is used as a resistor, since the heavily doped collector layer 302b exists under the base layer 303b, the resistor comprised of the base layer 303b undesirably includes a capacitance component. Furthermore, since the base layer 303b has a thickness of as very small as 1,000 Å or less, the resistance of the resistor 303b varies.

SUMMARY OF THE INVENTION

It is, therefore, an object of the present invention to provide a semiconductor device in which a resistor with a desired resistance can be integrally built together with an HBT device without adversely affecting the characteristics of the HBT device, and a method of manufacturing the same.

In order to achieve the above object, according to an aspect of the present invention, there is provided a semiconductor device having an integral built-in bipolar transistor and resistor, the bipolar transistor being obtained by sequentially forming a subcollector layer, a collector layer, a base layer, and an emitter layer on an insulating semiconductor substrate, wherein the subcollector layer of the bipolar transistor is formed of two subcollector layers with different thicknesses, a resistor layer is formed at the same level as, among the subcollector layers, one layer away from the collector layer, from the same material as that of the subcollector away from the collector layer, and the resistor layer forms the resistor.

BRIEF DESCRIPTION OF THE DRAWINGS

FIGS. 2 to 5 are sectional views showing a method of manufacturing the semiconductor device shown in FIG. 1 in the order of manufacturing steps;

FIG. 6 is a sectional view showing a semiconductor device according to the second embodiment of the present invention;

DESCRIPTION OF THE PREFERRED EMBODIMENTS (First Embodiment)

Figure 1:
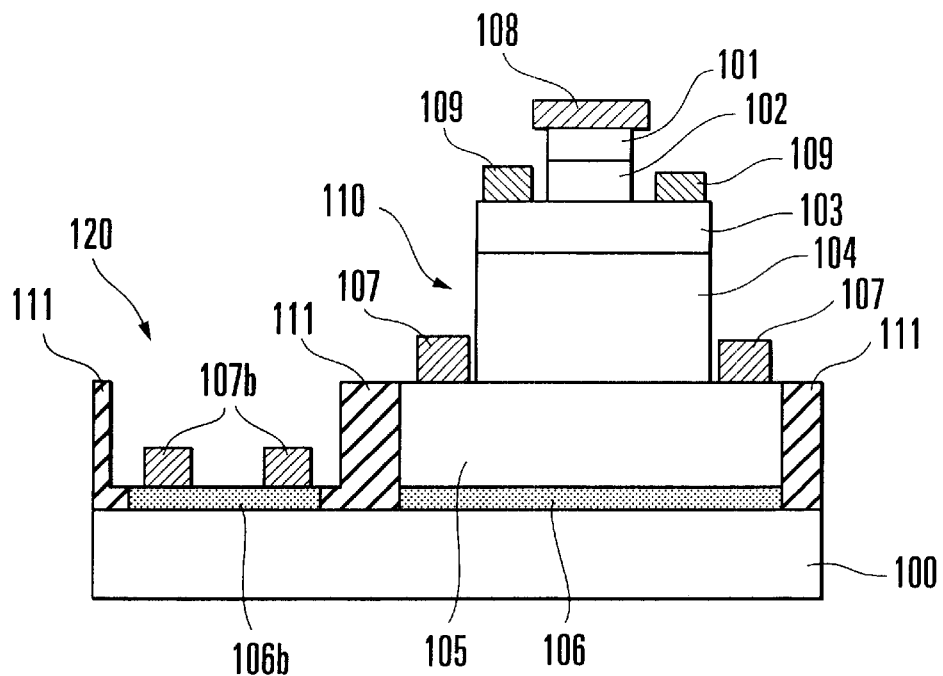
FIG. 1 is a sectional view showing a semiconductor device according to the first embodiment of the present invention.

FIG. 1 shows a semiconductor device according to the first embodiment of the present invention, which has an integral built-in a bipolar transistor 110 and resistor 120.

The bipolar transistor 110 built into the semiconductor device is obtained by sequentially forming subcollector layers 106 and 105, a collector layer 104, a base layer 103, and an emitter layer 102 on an insulating semiconductor substrate 100 by epitaxial growth, as shown in FIG. 1, and forming a collector electrode 107, base electrode 109, and emitter electrode 108 respectively on the subcollector layer 105, the base layer 103, and an emitter cap layer 101 of the emitter layer 102.

Implantation regions 111 are formed for element isolation between the bipolar transistor 110 and resistor 120.

In the first embodiment, the subcollector layers 105 and 106 constituting the bipolar transistor 110 form a two-layered structure having layers with different thicknesses. A resistor layer 106b is formed at the same level as one subcollector layer 106 away from the collector layer 104, from the same material as that of the subcollector layer 106. The resistor 120 is formed of the resistor layer 106b made of the same material as that of the subcollector layer 106.

A pair of electrodes 107b are formed on the resistor layer 106b that forms the resistor 120. The pair of electrodes 107b are formed on the resistor layer 106b in the step of forming the collector electrode 107 of the bipolar transistor 110.

The subcollector layers 105 and 106 of the bipolar transistor 110 are formed such that the upper layer is thick while the lower layer is thin. The lower layer with a thin-film structure is used as the resistor layer 106b.

To manufacture the semiconductor device shown in FIG. 1, the subcollector layers 105 and 106 adjacent to the collector layer 104 that forms the bipolar transistor 110 are formed by epitaxial growth to constitute a two-layered structure having layers with different thicknesses. The resistor layer 106 b is formed at the same level as one thin subcollector layer 106 by epitaxial growth, from the same material as that of the subcollector layer 106. The thin resistor layer 106b forms the resistor 120.

In the semiconductor device having the built-in bipolar transistor 110, since the collector layer 104 and collector electrode 107 of the bipolar transistor 110 are accessed through the subcollector layer 105, the subcollector layer 105 must have a low sheet resistance, and its thickness must be increased by considering this. When, however, the thickness is increased, the resistance decreases, which is a contradictory, phenomenon.

According to the first embodiment of the present invention, the subcollector layers 105 and 106 are formed into a two-layered structure by epitaxial growth, the lower subcollector layer 106 away from the collector layer 104 is thinner than the subcollector layer 105, and the thin resistor layer 106b is formed at the same level as the thin subcollector layer 106. When the thickness of the thin resistor layer 106b is adjusted within a wide range with good controllability, the resistance of the resistor 120 constituted by this thin resistor layer 106b can be adjusted to a desired value.

While the subcollector layers are formed by epitaxial growth, the two subcollector layers 105 and 106 are formed on the formation region of the bipolar transistor 110 and resistor 120. If the upper subcollector layer 105 and lower subcollector layer 106 are made of materials having etching selectivity, only the upper subcollector layer 105 at the formation region of the resistor 120 can be selectively removed, and the lower subcollector layer 106 can be left as the thin resistor layer 106b.

A method of manufacturing this semiconductor device will be described by way of a practical example.

Figure 2:
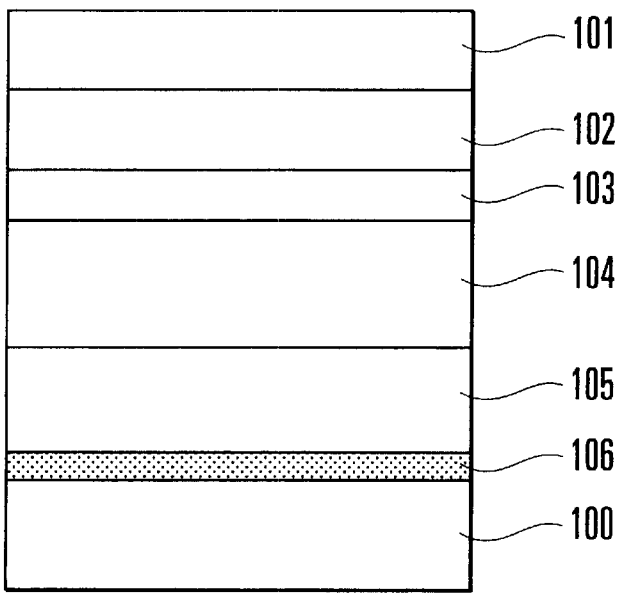

As shown in FIG. 2, for example, the subcollector layers 106 and 105 employing materials having etching selectivity are formed on the insulating semiconductor substrate 100 made of GaAs or the like by epitaxial growth to make a two-layered structure. In this case, the material of the insulating semiconductor substrate 100 changes depending on the material of the bipolar transistor to be formed and can be, e.g., silicon in place of GaAs.

Of the subcollector layers forming the two-layered structure, the lower subcollector layer 106 away from the collector layer 104 is formed thin, while the upper subcollector layer 105 is formed thick, so that the collector resistance of the HBT device is decreased.

Regarding the combination of the two subcollector layers 106 and 105, for example, GaAs is used to form the upper subcollector layer 105 adjacent to the collector layer 104, and AlGaAs is used to form the lower subcollector layer 106 away from the collector layer 104.

Alternatively, for example, GaAs is used to form the subcollector layer 105 adjacent to the collector layer 104, and InGaP is used to form the subcollector layer 106. GaAs may be used to form the subcollector layer 105, and InP may be used to form the subcollector layer 106. GaAs may be used to form the subcollector layer 105 adjacent to the collector layer 104, and InGaAsP may be used to form the subcollector layer 106 away from the collector layer 104.

GaAs may be used to form the subcollector layer 105, and AlAs may be used to form the subcollector layer 106. AlGaAs may be used to form the subcollector layer 105, and GaAs may be used to form the subcollector layer 106. InGaP may be used to form the subcollector layer 105, and GaAs may be used to form the subcollector layer 106.

InP may be used to form the subcollector layer 105, and GaAs may be used to form the subcollector layer 106 away from the collector layer 104. InGaAsP may be used to form the subcollector layer 105, and GaAs may be used to form the subcollector layer 106 away from the collector layer 104.

AlAs may be used to form the subcollector layer 105, and GaAs may be used to form the subcollector layer 106 away from the collector layer 104.

The collector layer 104, base layer 103, emitter layer 102, and emitter cap layer 101 are sequentially formed on the subcollector layer 105 by epitaxial growth.

Figure 12:
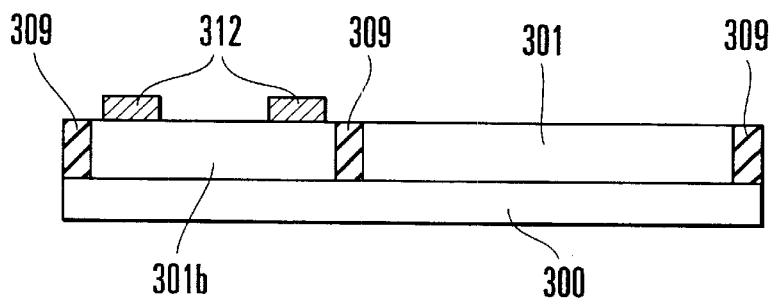
FIG. 12 is a sectional view showing another conventional semiconductor device.
Figure 13:
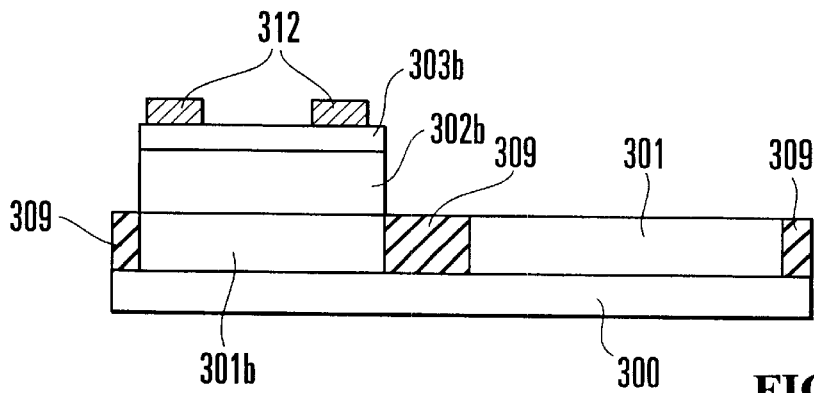
FIG. 13 is a sectional view showing still another conventional semiconductor device.

Regarding the epitaxial structure shown in FIG. 12, for example, InGaAs, GaAs, or the like is used to form the emitter cap layer 101, InGaP, AlGaAs, or the like is used to form the emitter layer 102, GaAs, InGaAs, or the like is used to form the base layer 103, and GaAs, AlGaAs, InGaP, or the like is used to form the collector layer 104.

Figure 3:
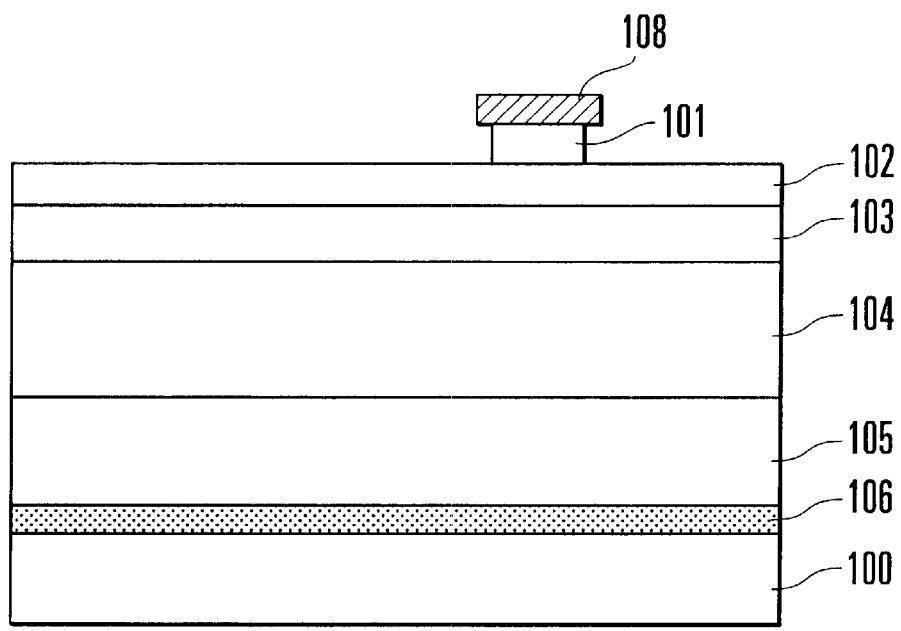

As shown in FIG. 3, a WSi film 108 to serve as an emitter electrode is formed on the entire surface of the uppermost emitter cap layer 101. After that, the surface of the remaining emitter layer 102 is exposed by using a photoresist (PR) to leave the emitter electrode 108 and emitter cap layer 101.

Figure 4:
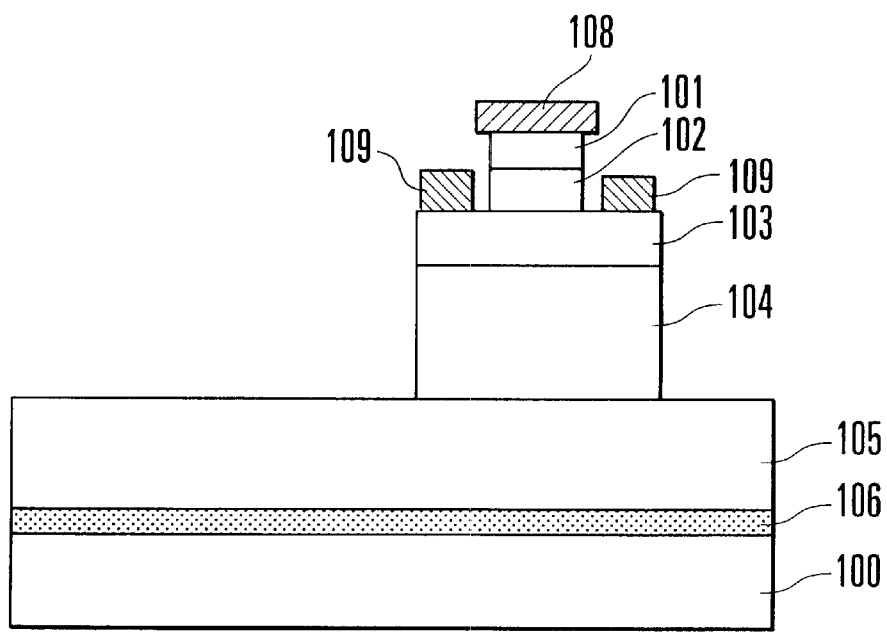

As shown in FIG. 4, the emitter layer 102 is etched by using the emitter cap layer 101 as a mask. A metal layer is formed on the exposed emitter layer 102 by vapor deposition. Then, the metal layer is etched to form the base electrode 109 adjacent to the emitter layer 102.

Subsequently, the base layer 103 and collector layer 104 are patterned by using a photoresist (PR), and the subcollector layer 105 is exposed to leave the patterned base layer 103 and collector layer 104.

As shown in FIG. 5, only that portion of the subcollector layer 105 which is within a region where the resistor 120 is to be formed is removed by selective etching, to expose that portion of the subcollector layer which is within the region where the resistor 120 is to be formed, as the subcollector layer (resistor layer) 106b where the resistor 120 is to be formed. The resultant subcollector layer 106b is used as the resistor 120.

Finally, as shown in FIG. 1, ions are implanted for element isolation at each implantation region 111 set at the boundary between the resistor forming region and the HBT forming region. A metal film is formed by vapor deposition on the subcollector layer 106 in the HBT forming region and the resistor (resistor layer) 106b in the resistor forming region, and is patterned to form the collector electrode 107 on the subcollector layer 106 in the HBT forming region, and the resistor electrodes 107b on the resistor layer 106b in the resistor forming region.

According to the first embodiment of the present invention, the resistor layer 106b within the region where the resistor 120 is to be formed is formed in the same step as that of forming the subcollector layer 106 in the HBT forming region. Therefore, the resistance of the resistor 120 formed by the first embodiment of the present invention is determined by only the dose and thickness of the subcollector layer 106 which is to be formed by epitaxial growth.

Accordingly, the resistor layer 106b of the resistor 120 formed by the first embodiment of the present invention can be formed as a sheet resistance layer with a very good controllability and a high resistance. The area of the resistor can thus be reduced, so that a resistor with high precision can be formed.

(Second Embodiment)

FIG. 6 shows a semiconductor device according to the second embodiment of the present invention. A bipolar transistor 110 built into the semiconductor device is obtained by sequentially forming a subcollector layer 105, a collector layer 104, a base layer 103, and an emitter layer on an insulating semiconductor substrate 100, and respectively forming a collector electrode 107, base electrode 109, and emitter electrode 108 on the subcollector layer 105, the base layer 103, and an emitter cap layer 101 on the emitter layer.

According to the characteristic feature of the present invention, in the semiconductor device of the second embodiment, emitter layers 102a and 102b which make up the bipolar transistor 110 form a two-layered structure, resistor layers 102c and 102d are formed at the same levels as the emitter layers 102a and 102b which form the two-layered structure, from the same materials as those of the emitter layers 102a and 102b, and the resistor layer 102d, or the resistor layers 102c and 102d make up a resistor 120.

The resistor layer 102d has a pair of electrodes 108b, in the same manner as in the first embodiment. In this second embodiment as well, to form the insulating semiconductor substrate 100, a material such as GaAs or silicon is used in accordance with the type of the transistor to be formed.

Of the two emitter layers 102a and 102b that make up the bipolar transistor 110, the lower layer 102b is used as a hetero-guard ring layer for protecting the base layer 103 which forms the bipolar transistor 110.

To manufacture the semiconductor device according to the second embodiment of the present invention, the emitter layers 102a and 102b that make up the bipolar transistor 110 are formed to constitute a two-layered structure. The resistor layers 102c and 102d are formed at the same levels as the emitter layers 102a and 102b constituting the two-layered structure, from the same materials as those of the emitter layers 102a and 102b. The resistor layer 102d, or the resistor layers 102c and 102d make up the resistor 120.

Since the resistor 120 according to the second embodiment of the present invention is formed of one resistor layer 102d or two resistor layers 102c and 102d, the resistance can be freely designed by changing the thickness and dose of the emitter layers 102a and 102b.

A method of manufacturing the semiconductor device according to the second embodiment of the present invention will be described by way of a practical example.

Figure 7:
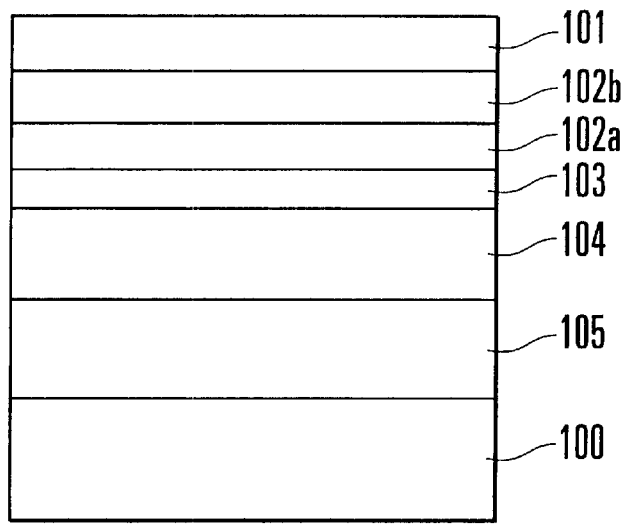
FIGS. 7 to 10 are sectional views showing a method of manufacturing the semiconductor device shown in FIG. 6 in the order of manufacturing steps.

First, as shown in FIG. 7, the subcollector layer 105 is formed to cover the resistor forming region and HBT forming region on the substrate 100 by epitaxial growth to a thickness necessary for ensuring a necessary breakdown voltage.

The collector layer 104, the base layer 103, the emitter layer, and the emitter cap layer 101 are formed on the subcollector layer 105 by epitaxial growth. According to the second embodiment of the present invention, the emitter layers 102a and 102b of the bipolar transistor 110 are formed to make up a two-layered structure.

Regarding the epitaxial structure shown in FIG. 7, for example, InGaAs or GaAs is used to form the emitter cap layer 101, GaAs or InGaAs is used to form the base layer 103, GaAs, AlGaAs, or InGaP is sued to form the collector layer 104, and GaAs, AlGaAs, or InGaP is used to form the subcollector layer 105.

To form the emitter layers 102a and 102b that make up the two-layered structure, materials having etching selectivity are used. To form the upper emitter layer 102b, a material having etching selectivity with the emitter cap layer 101 is used.

More specifically, regarding the emitter layers 102a and 102b, for example, AlGaAs is used to form the upper emitter layer 102b, and InGaP is used to form the lower emitter layer 102a. Alternatively, InGaP is used to form the upper emitter layer 102b, and AlGaAs or the like is used to form the lower emitter layer 102a.

Figure 8:
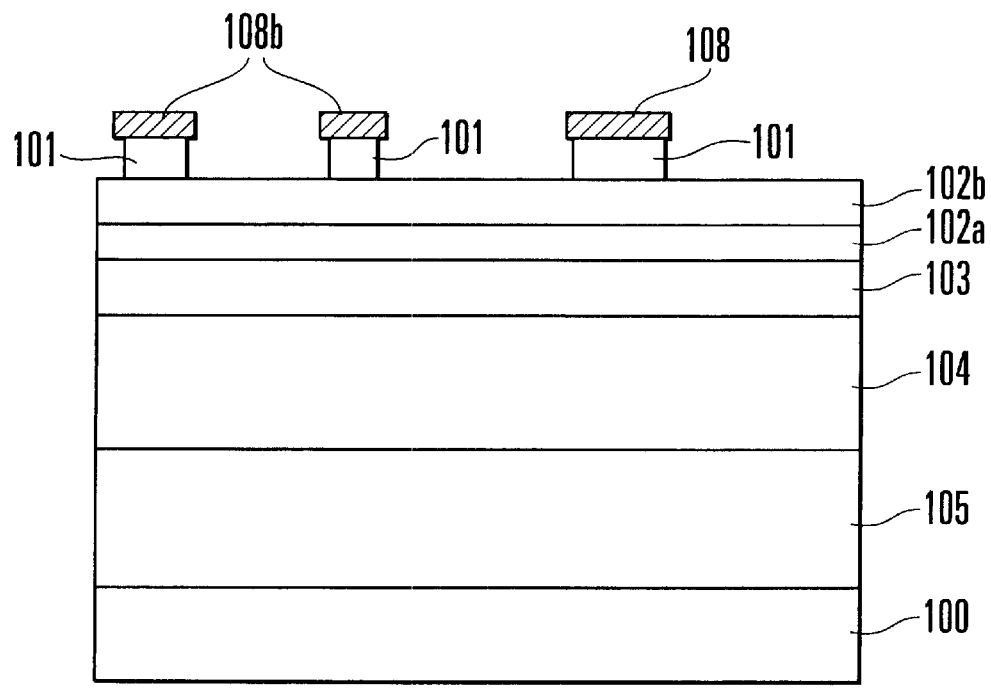

As shown in FIG. 8, a WSi film 108 is formed on the entire surface of the uppermost emitter cap layer 101. After that, the emitter electrode 108, electrodes 108b, and emitter cap layer 101 are patterned by using a PR (photoresist) to expose the necessary surface of the upper emitter layer 102b.

Figure 9:
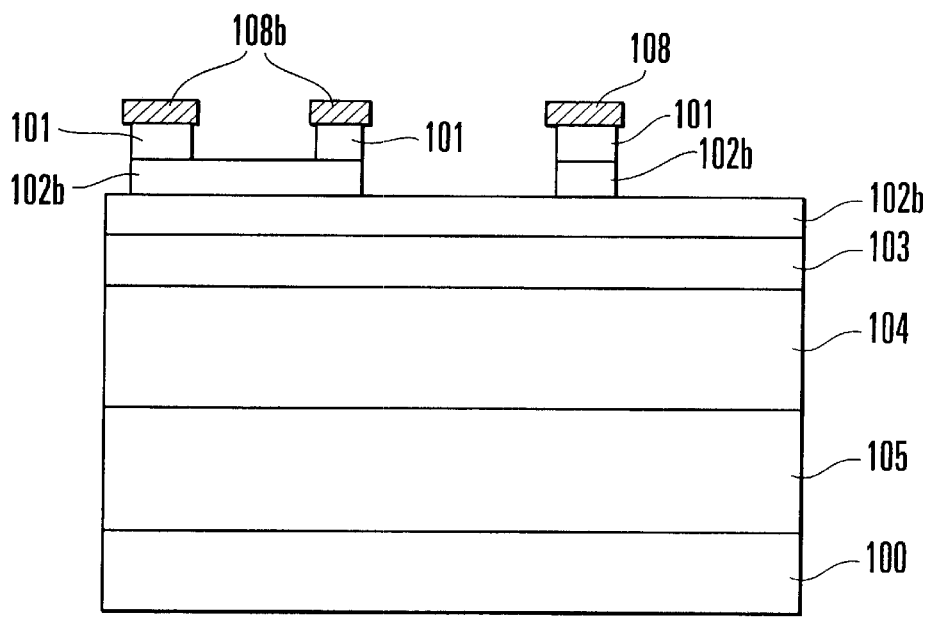

As shown in FIG. 9, the upper emitter layer 102b is patterned to expose the surface of the lower base layer 103 while leaving the patterned emitter layer 102b in the HBT forming region and the resistor layer 102d (at the same level as the emitter layer 102b) at the resistor forming region.

Figure 10:
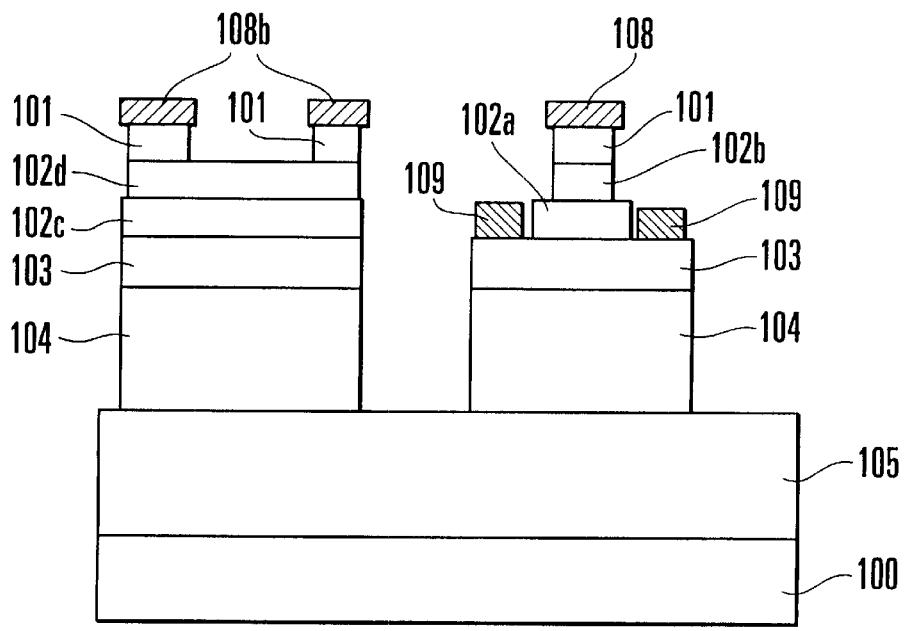
Figure 11:
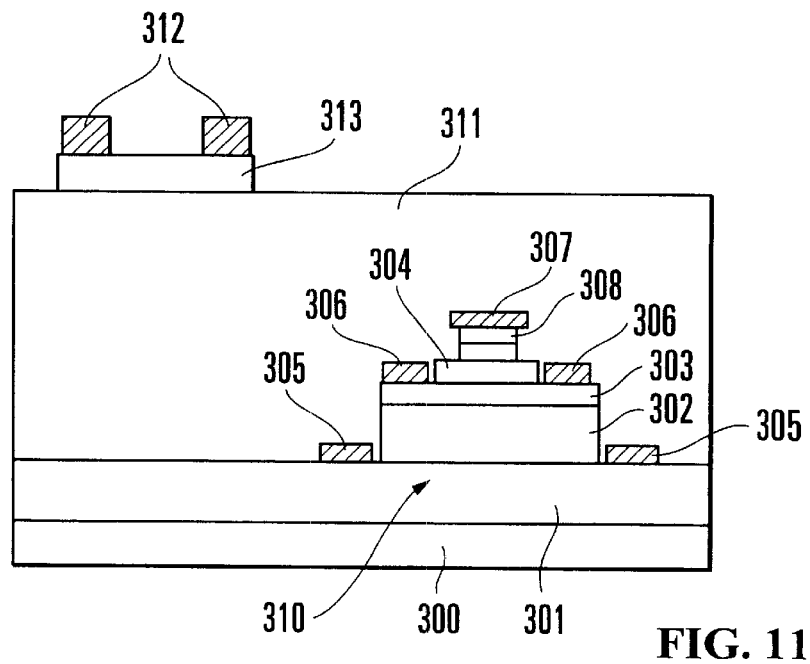
FIG. 11 is a sectional view showing a conventional semiconductor device.

As shown in FIG. 10, the exposed emitter layer 102a is patterned to expose the surface of the lower base layer 103 while leaving the patterned emitter layer 102a in the HBT forming region and the resistor layer 102c (at the same level as the emitter layer 102a) in the resistor forming region. A metal layer is deposited on the exposed base layer 103, and is etched to form the base electrode 109 on the base layer 103. Since the resistor layers 102c and 102d are formed in the resistor forming region by patterning the emitter layers 102a and 102b, they are made of the same materials as those of the emitter layers 102a and 102b, at the same levels as them.

Subsequently, the base layer 103 and collector layer 104 are patterned by using a photoresist (PR).

Finally, as shown in FIG. 6, ions are implanted for element isolation at each implantation region 111 set at the boundary between the resistor forming region and HBT forming region. Ions are also implanted to a portion 112 of the lower emitter layer 102a exposed sideways from the upper emitter layer 102a. A hetero-guard ring 112 for protecting the base layer 103 is thus formed by using the lower emitter layer 102a.

The collector electrode 107 is formed on the subcollector layer 105 adjacent to the collector layer 104 in the HBT forming region.

In FIG. 6, the resistor 120 is made up of the resistor layers 102c and 102d that are at the same levels as the emitter layers 102a and 102b. The base layer protection layer (hetero-guard ring) 112 shown in FIG. 6 is formed of only the lower emitter layer 102a.

Therefore, according to the second embodiment of the present invention, when the resistor layers 102c and 102d at the same levels as the emitter layers 102a and 102b are used as the resistor 120, the thickness and dose of the lower resistor layer 102c can be freely designed by changing the thickness and dose of the upper resistor layer 102d, although the degree of design freedom is small since the portion 112 need be formed.

In the first and second embodiments, a heterojunction bipolar transistor (HBT) is used as the bipolar transistor. However, a bipolar transistor other than a heterojunction bipolar transistor may be used.

As has been described above, according to the present invention, a resistor with a desired resistance can be easily obtained without adversely affecting the characteristics of a bipolar transistor.

When a resistor with a high resistance is to be obtained, its area does not increase, so that its area can be substantially reduced.

What is claimed is:

1. A semiconductor device having an integral built-in bipolar transistor and resistor, said transistor being obtained by sequentially forming a subcollector layer, a collector layer, a base layer, and an emitter layer on an insulating semiconductor substrate, wherein:

said subcollector layer of said bipolar transistor is formed of a first subcollector sublayer of a first thickness, and a second subcollector of a second thickness formed on said first subcollector sublayer, said collector layer being formed on said second subcollector sublayer, A resistor layer is formed from the same material as the first subcollector sublayer and has a top surface at least substantially coplanar with a top surface of the first subcollector sublayer and has a bottom surface at least substantially coplanar with a bottom surface of the first subcollector sublayer, and said resistor layer forms said resistor.

2. A device according to claim 1, wherein said resistor layer is thinner than said second subcollector sublayer.

3. A device according to claim 1, wherein said bipolar transistor is a heterojunction bipolar transistor.

4. A semiconductor device having an integral built-in bipolar transistor and resistor, said bipolar transistor being obtained by sequentially forming a subcollector layer, a collector layer, a base layer, and an emitter layer on an insulating semiconductor substrate, wherein:

said emitter layer of said bipolar transistor is formed of a first emitter sublayer and a second emitter sublayer, a resistor layer is formed of a first resistor sublayer and a second resistor sublayer, said first resistor sublayer being formed from the same material as said first emitter sublayer, said first resistor sublayer having a bottom surface at least substantially coplanar with a bottom surface of said first emitter sublayer, said second resistor sublayer being formed from the same material as said second emitter sublayer, said second resistor sublayer having a top surface at least substantially coplanar with a top surface of said second emitter sublayer, a surface where said first resistor sublayer and said second resistor sublayer meet being at least substantially coplanar with a surface where said first emitter sublayer and said second emitter sublayer meet, and said resistor layer forms said resistor.

5. A device according to claim 4 wherein, of said two emitter layers constituting said bipolar transistor, a lower layer is used as a hetero-guard ring layer for protecting said base layer constituting said bipolar transistor.

6. A device according to claim 4, wherein said two emitter layers constituting said bipolar transistor respectively form resistors.

7. A method of manufacturing a semiconductor device having an integral built-in bipolar transistor and resistor, said bipolar transistor being obtained by sequentially forming a subcollector layer, a collector layer, a base layer, and an emitter layer on an insulating semiconductor substrate, said method comprising:

forming said subcollector layer of said bipolar transistor as a two-layered structure having a first subcollector sublayer of a first thickness and a second subcollector sublayer of a second thickness formed on said first subcollector sublayer, said collector layer being formed on said second subcollector sublayer, forming a resistor layer from the same material as the first subcollector sublayer and having a top surface at least substantially coplanar with a top surface of the first subcollector sublayer and having a bottom surface at least substantially coplanar with a bottom surface of the first subcollector sublayer, and forming said resistor with said resistor layer.

8. A method of manufacturing a semiconductor device having an integral built-in bipolar transistor and resistor, said bipolar transistor being obtained by sequentially forming a subcollector layer, a collector layer, a base layer, and an emitter layer on an insulating semiconductor substrate, said method comprising:

forming said emitter layer of said bipolar transistor as a two-layered structure having a first emitter sublayer and a second emitter sublayer, forming a resistor layer of a first resistor sublayer and a second resistor sublayer, said first resistor sublayer being formed from the same material as said first emitter sublayer, said first resistor sublayer having a bottom surface at least substantially coplanar with a bottom surface of said first emitter sublayer, said second resistor sublayer being formed from the same material as said second emitter sublayer, said second resistor sublayer having a top surface substantially coplanar with a top surface of said second emitter sublayer, a surface where said first resistor sublayer and said second resistor sublayer meet being at least substantially coplanar with a surface where said first emitter sublayer and said second emitter sublayer meet, and forming said resistor with said resistor layer.

* * * * *